United States Patent
Chiang et al.

(10) Patent No.: US 11,122,660 B2
(45) Date of Patent: Sep. 14, 2021

(54) ELECTRONIC DEVICE AND LIGHT EMITTING UNIT DRIVING CIRCUIT THEREOF

(71) Applicant: InnoLux Corporation, Miao-Li County (TW)

(72) Inventors: Chien-Hsueh Chiang, Miao-Li County (TW); Tsau-Hua Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/702,557

(22) Filed: Dec. 4, 2019

(65) Prior Publication Data

US 2020/0221554 A1 Jul. 9, 2020

Related U.S. Application Data

(60) Provisional application No. 62/789,567, filed on Jan. 8, 2019.

(30) Foreign Application Priority Data

Jul. 26, 2019 (CN) .......................... 201910683440.4

(51) Int. Cl.
*H05B 45/345* (2020.01)
*H05B 45/10* (2020.01)
(Continued)

(52) U.S. Cl.
CPC ......... *H05B 45/345* (2020.01); *G09G 3/3233* (2013.01); *H01L 27/124* (2013.01); *H01L 27/1255* (2013.01); *H05B 45/10* (2020.01)

(58) Field of Classification Search
CPC ...... H05N 45/345; H05N 45/10; H05N 45/44; H01L 27/124; H01L 27/1255; G09G 2300/0842; G09G 2300/0852; G09G 2300/0819; G09G 3/3233; H05B 45/345; H05B 45/10; H05B 45/44
See application file for complete search history.

(56) References Cited

U.S. PATENT DOCUMENTS

2007/0164938 A1* 7/2007 Shin ..................... G09G 3/3233
345/76
2008/0111809 A1 5/2008 Lo
(Continued)

FOREIGN PATENT DOCUMENTS

WO 2017/133088 A1 8/2017

*Primary Examiner* — Raymond R Chai
(74) *Attorney, Agent, or Firm* — Winston Hsu

(57) ABSTRACT

An electronic device has a light emitting unit driving circuit. The driving circuit has a first driving transistor, a second driving transistor, and a light emitting unit. The first driving transistor has a first channel width and a first channel length and is used to provide a first current. The second driving transistor has a second channel width and a second channel length and is used to provide a second current. The light emitting unit is coupled to the first driving transistor and the second driving transistor for receiving at least one of the first current and the second current to emit light. A ratio of the first channel width to the first channel length is greater than a ratio of the second channel width to the second channel length.

12 Claims, 11 Drawing Sheets

(51) Int. Cl.
  *H01L 27/12* (2006.01)
  *G09G 3/3233* (2016.01)

(56) References Cited

U.S. PATENT DOCUMENTS

2015/0008405 A1* 1/2015 Kim .................. H01L 27/124
                                                    257/40
2018/0182284 A1* 6/2018 Chung ............... G09G 3/3225
2018/0337288 A1* 11/2018 Shin .................. G09G 3/2007

* cited by examiner

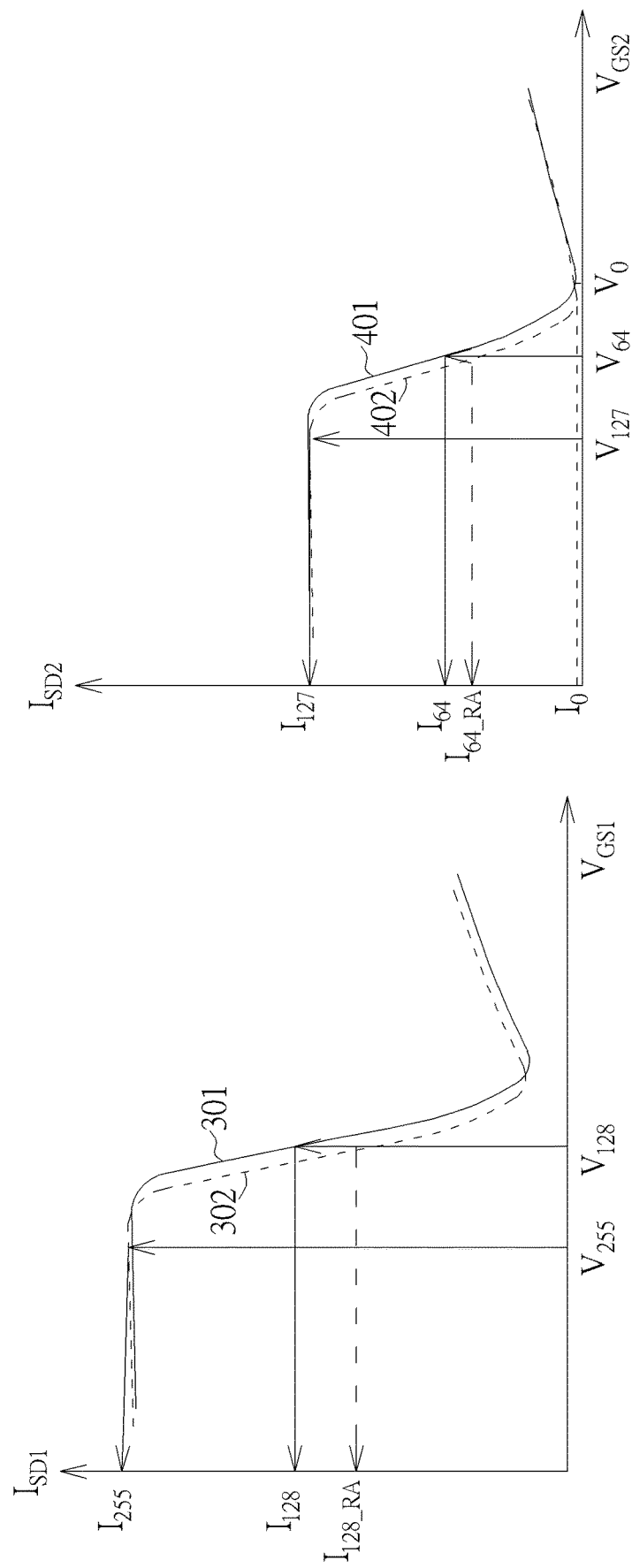

ELECTRONIC DEVICE AND LIGHT EMITTING UNIT DRIVING CIRCUIT THEREOF

CROSS REFERENCE TO RELATED APPLICATION

This non-provisional application claims priority of U.S. provisional application No. 62/789,567, filed on Jan. 8, 2019, and China patent application No. 201910683440.4, filed on Jul. 26, 2019, included herein by reference in their entirety.

BACKGROUND OF THE DISCLOSURE

1. Field of the Disclosure

The present disclosure relates to an electronic device and a driving circuit, and more particularly to a driving circuit for driving a light emitting unit.

2. Description of the Prior Art

With the development of digital technology, electronic devices have been widely used in various aspects of daily life. However, current electronic devices are not satisfactory in all respects.

SUMMARY OF THE DISCLOSURE

An embodiment of the present disclosure provides a light emitting unit driving circuit comprising a first driving transistor, a second driving transistor, and a light emitting unit. The first driving transistor has a first channel width and a first channel length and is configured to provide a first current. The second driving transistor has a second channel width and a second channel length and is configured to provide a second current. The light emitting unit is electrically connected to the first driving transistor and the second driving transistor and is configured to receive at least one of the first current and the second current so as to emit light. A first ratio of the first channel width to the first channel length is greater than a second ratio of the second channel width to the second channel length.

Another embodiment disclosed provides an electronic device including a light emitting unit driving circuit. The light emitting unit driving circuit comprises a first driving transistor, a second driving transistor, and a light emitting unit. The first driving transistor has a first channel width and a first channel length and is configured to provide a first current. The second driving transistor has a second channel width and a second channel length and is configured to provide a second current. The light emitting unit is electrically connected to the first driving transistor and the second driving transistor and is configured to receive at least one of the first current and the second current so as to emit light. A first ratio of the first channel width to the first channel length is greater than a second ratio of the second channel width to the second channel length.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 5 is a graph showing a relationship between a gate-source voltage and a source-drain current of the first driving transistor of the light emitting unit driving circuit in FIG. 2 according to an embodiment of the present disclosure.

FIG. 6 is a graph showing a relationship between a gate-source voltage and a source-drain current of a second driving transistor of the light emitting unit driving circuit in FIG. 2 according to an embodiment of the present disclosure.

DETAILED DESCRIPTION

The terms "about" or "substantially" generally mean within 20% of a given value or range, or mean within 10%, 5%, 3%, 2%, 1%, or 0.5% of a given value or range. The quantity given here is an approximate quantity. That is, the meaning of "about" or "substantially" may be implied without specifying "about" or "substantially".

In the present disclosure, "coupling" may include "electrical connection." For example, the A component "couples" the B component to include "the A component is coupled to the B component" and "the A component is electrically connected to the B component". "The A component is electrically connected to the B component" may mean that a current would flow from the A component to the B component.

Figure 1:
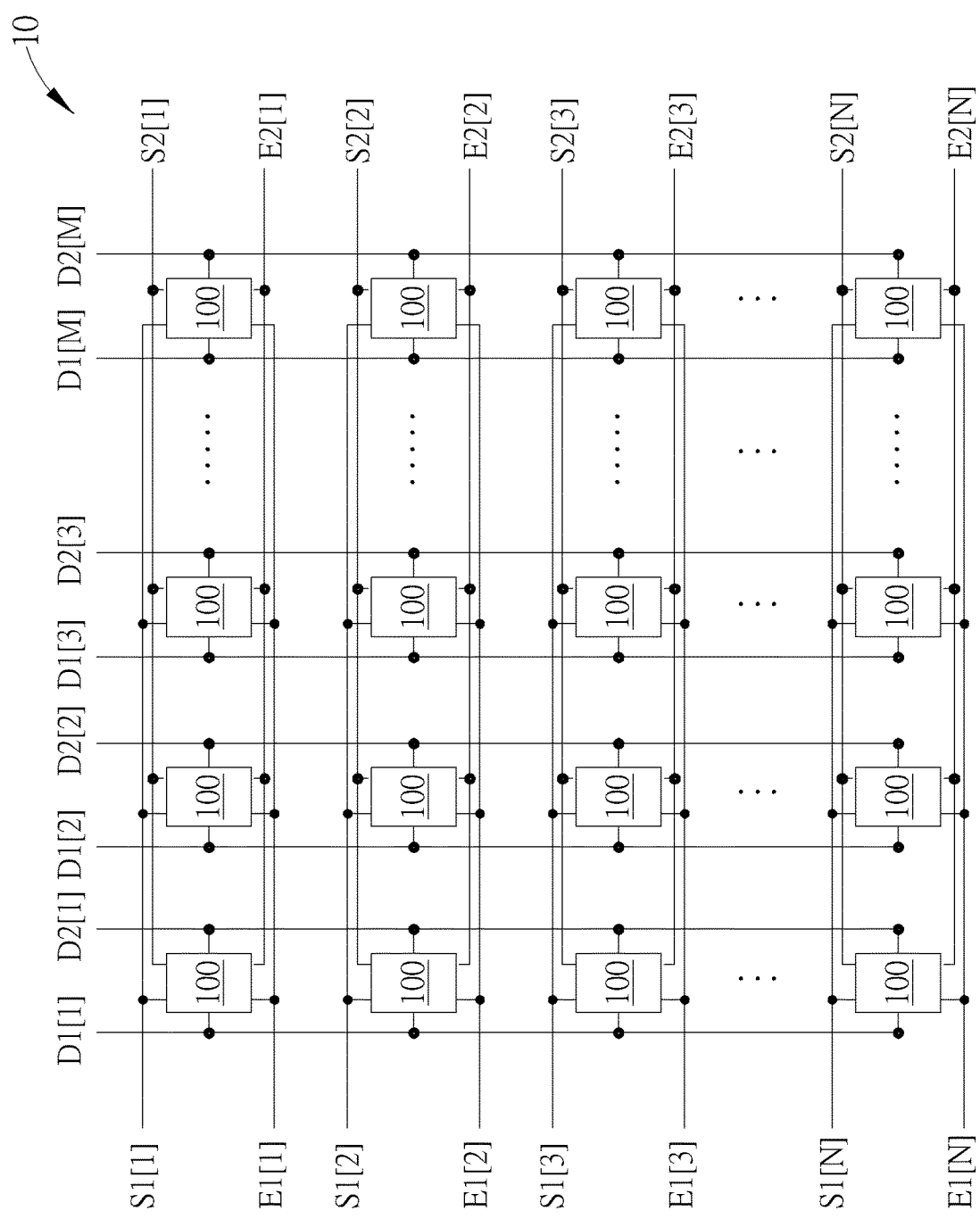
FIG. 1 is a circuit diagram of an electronic device according to an embodiment of the present disclosure.
Figure 2:
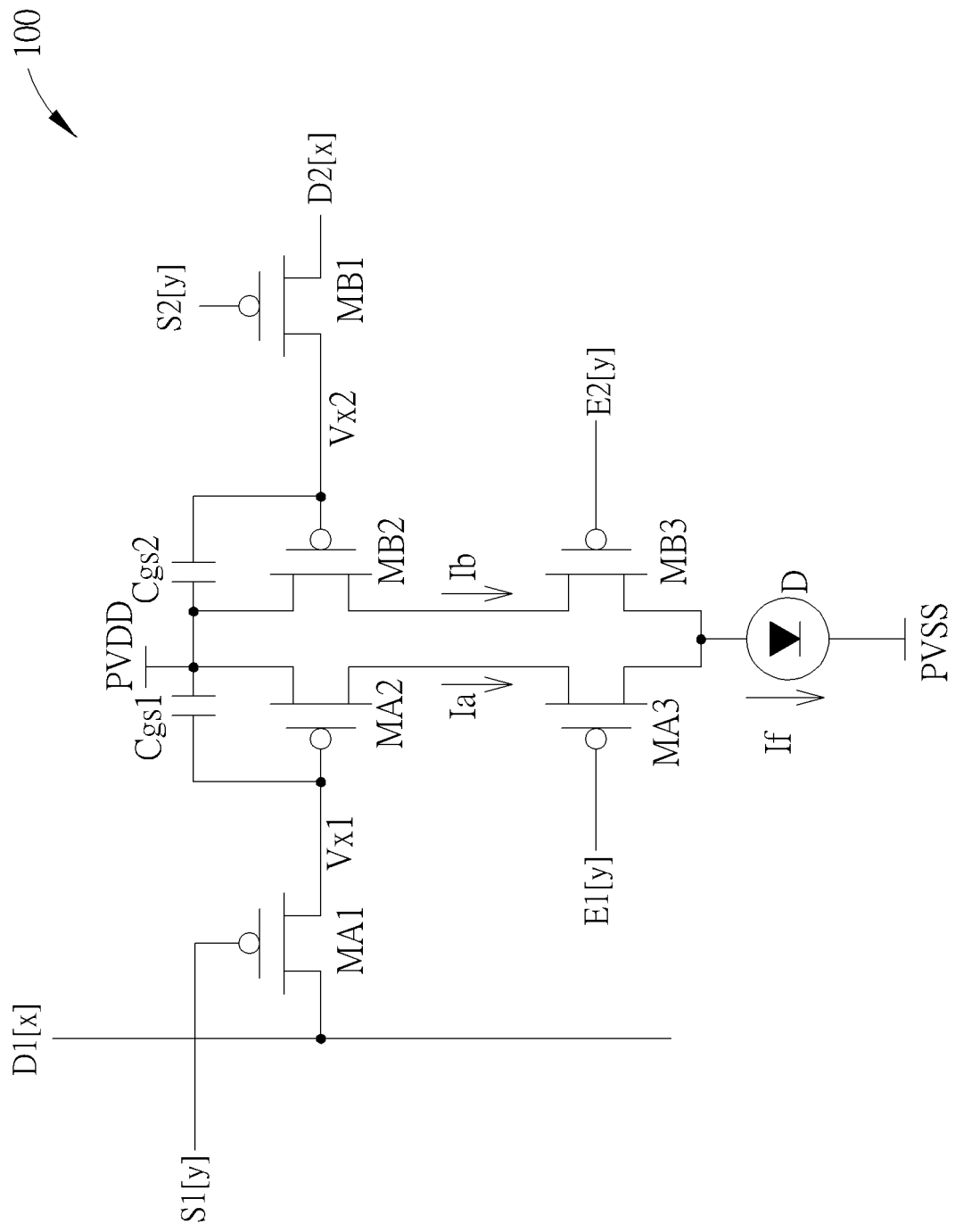
FIG. 2 is a circuit diagram of a light emitting unit driving circuit of the electronic device in FIG. 1 according to an embodiment of the present disclosure.

FIG. 1 is a circuit diagram of an electronic device 10 according to an embodiment of the present disclosure, and FIG. 2 is a circuit diagram of a light emitting unit driving circuit 100 of the electronic device 10 in FIG. 1 according to an embodiment of the present disclosure. In an embodiment, the electronic device of the present disclosure may comprise a display device, a sensing device, an antenna device, a tiled device, a touch device, other suitable electronic devices, or a combination thereof, but is not limited thereto. The electronic device 10 may comprise a plurality of light emitting unit driving circuits 100, a plurality of first data lines D1[1] to D1[M], a plurality of second data lines D2[1] to D2[M], a plurality of first scans lines S1[1] to S1[N], a plurality of second scan lines S2[1] to S2[N], a plurality of first control lines E1[1] to E1[N], and a plurality of second control lines E2[1] to E2[N]. The light emitting unit driving circuit 100 may be arranged in a matrix of M columns and N rows, and M and N may be integers greater than or equal to 2. The light emitting unit driving circuit 100 may be coupled to a corresponding first data line D1[x], a corresponding second data line D2[x], a corresponding first scan line S1[y], a corresponding second scan line S2[y], a corresponding first control line E1[y], and a corresponding second control line E2[y]. Wherein, 1≤x≤M, 1≤y≤N. In an embodiment, the light emitting unit driving circuit 100 may be used to drive a light emitting unit of the electronic device 10, but is not limited thereto.

Referring to FIG. 2, the light emitting unit driving circuit 100 may comprise a first driving transistor MA2, a second driving transistor MB2, and a light emitting unit D. The first terminals (e.g., the source) of the second driving transistor MB2 and the first driving transistor MA2 may be coupled to a first system voltage PVDD. The first system voltage PVDD is used to supply power to the first driving transistor MA2 and the second driving transistor MB2 to enable the first driving transistor MA2 to generate and provide a first current Ia, and to enable the second driving transistor MB2 to generate and provide a second current Ib. The magnitude of the first current Ia provided by the first driving transistor MA2 may be determined by a bias voltage Vx1 of the control terminal (e.g., the gate) of the first driving transistor MA2. Similarly, the magnitude of the second current Ib provided by the second driving transistor MB2 may be determined by a bias voltage Vx2 of the control terminal (e.g., the gate) of the second driving transistor MB2. Therefore, the magnitudes of the first current Ia and the second current Ib may be adjusted by adjusting the bias voltages Vx1 and Vx2.

In an embodiment of the disclosure, the light emitting unit driving circuit 100 further comprises a first switching transistor MA1 and a second switching transistor MB1 for respectively adjusting the bias voltage Vx1 to the voltage level of the first data line D1[x], and adjusting the bias voltage Vx2 to the voltage level of the second data line D2[x]. The first switching transistor MA1 is coupled to a corresponding first data line D1[x], the first driving transistor MA2, and a corresponding first scan line S1[y]. In an embodiment, the first switching transistor MA1 is electrically connected to the first data line D1[x], the first driving transistor MA2, and the first scan line S1[y]. For example, the first terminal (e.g., one of the source and the drain) of the first switching transistor MA1 may be coupled to the corresponding first data line D1[x], and the second terminal (e.g., the other one of the source and the drain) of the first switching transistor MA1 may be coupled to a control terminal of the first driving transistor MA2, and a control terminal (e.g., the gate) of the first switching transistor MA1 may be coupled to the corresponding first scan line S1[y]. When the voltage level of the first scan line S1[y] is low, the first switching transistor MA1 is turned on, so that the first data line D1[x] is coupled to the control terminal of the first driving transistor MA2, thereby the bias voltage Vx1 is adjusted to the voltage level of the first data line D1[x]. When the voltage level of the first scan line S1[y] is high, the first switching transistor MA1 is turned off, and the bias voltage Vx1 is maintained at the original voltage level. Similarly, the second switching transistor MB1 is coupled to a corresponding second data line D2[x], the second driving transistor MB2, and a corresponding second scan line S2[y]. In an embodiment, the second switching transistor MB1 is electrically connected to the corresponding second data line D2[x], the second driving transistor MB2, and the corresponding second scan line S2[y]. For example, a first terminal (e.g., one of the source and the drain) of the second switching transistor MB1 may be coupled to the corresponding second data line D2[x], a second terminal (e.g., the other one of the source and the drain) of the second switching transistor MB1 may be coupled to a control terminal of the second driving transistor MB2, and a control terminal (e.g., the gate) of the second switching transistor MB1 may be coupled to the corresponding second scan line S2[y]. When the voltage level of the second scan line S2[y] is low, the second switching transistor MB1 is turned on, and the second data line D2[x] is coupled to the control terminal of the second driving transistor MB2, thereby the bias voltage Vx2 is adjusted to the voltage level of the second data line D2[x]. When the voltage level of the second scan line S2[y] is high, the second switching transistor MB1 is turned off, and the bias voltage Vx2 is maintained at the original voltage level. It could be understood that, in some embodiments of the present disclosure, the light emitting unit driving circuit 100 may not necessarily comprise the first switching transistor MA1 and the second switching transistor MB1. In other words, the first switching transistor MA1 and the second switching transistor MB1 are optional components, the control terminal of the first driving transistor MA2 may be directly coupled to the first scan line S1[y], and the control terminal of the second driving transistor MB2 may be directly coupled to the second scan line S2[y].

Furthermore, the light emitting unit D may comprise, for example, an inorganic light emitting diode (LED), such as a sub-millimeter LED (mini LED) or a micro-light emitting diode (micro LED), an organic light emitting diode (OLED), quantum dot (QD), quantum dot light emitting diode (QLED, QDLED), fluorescent material, phosphor material, other suitable materials or a combination thereof, but not limited thereto. In this embodiment, one of the anode and cathode of the light emitting unit D (e.g., the anode) may be coupled to the first driving transistor MA2 and the second driving transistor MB2, and the other one of the anode and cathode of the light emitting unit D (e.g., the cathode) is coupled to the second system voltage PVSS. The second system voltage PVSS may be lower than the first system voltage PVDD. The light emitting unit D would emit light by receiving at least one of the first current Ia and the second current Ib. Further, when both the first driving transistor MA2 and the second driving transistor MB2 are turned on, the current If flowing through the light emitting unit D is equal to a sum of the first current Ia and the second current Ib (i.e., Ia+Ib). For example, when the first driving transistor MA2 is turned on and the second driving transistor MB2 is turned off, the current If flowing through the light emitting unit D may be substantially equal to the first current Ia. When the first driving transistor MA2 is turned off, and the second driving transistor MB2 is turned on, the current If flowing through the light emitting unit D may be substantially equal to the second current Ib. When both the first driving transistor MA2 and the second driving transistor MB2 are turned off, the current If flowing through the light emitting unit D is equal to zero, and the light emitting unit D would not emit light. By turning on/off of the first driving transistor MA2 and the second driving transistor MB2 as described above, the magnitude of the current If flowing through the light emitting unit D would be controlled. By changing the bias voltages Vx1 and Vx2, the operations of turning on/off the first driving transistor MA2 and the second driving transistor MB2 would be controlled.

In an embodiment of the present disclosure, the light emitting unit driving circuit 100 may further comprise a first light emitting control transistor MA3 and a second light emitting control transistor MB3. The first light emitting control transistor MA3 is coupled to the first driving transistor MA2 and the light emitting unit D, and is used to control whether the first current Ia flows to the light emitting unit D based on a first light emitting control signal (i.e., the voltage level of the first control line E1[y]). When the voltage level of the first control line E1[y] is low, the first light emitting control transistor MA3 is turned on, so that the first current Ia flows to the light emitting unit D. When the voltage level of the first control line E1[y] is high, the first light emitting control transistor MA3 is turned off, and the first driving transistor MA2 is electrically disconnected from the light emitting unit D, so that the first current Ia does not flow to the light unit D. Similarly, the second light emitting control transistor MB3 is coupled to the second driving transistor MB2 and the light emitting unit D, and is used to control whether the second current Ib flows to the light emitting unit D based on a second light emitting control signal (i.e., the voltage level of the second control line E2[y]). When the voltage level of the second control line E2[y] is low, the second light emitting control transistor MB3 is turned on, and the second current Ib flows to the light emitting unit D. When the voltage level of the second control line E2[y] is high, the second light emitting control transistor MB3 is turned off, and the second driving transistor MB2 is electrically disconnected from the light emitting unit D, so that the second current Ib does not flow to the light unit D. It could be understood that, in some embodiments of the present disclosure, the light emitting unit driving circuit 100 may not necessarily comprise the first light emitting control transistor MA3 and the second light emitting control transistor MB3. In other words, the first light emitting control transistor MA3 and the second light emitting control transistor MB3 are optional elements. The first driving transistor MA2 may be directly coupled to the light emitting unit D, and the second driving transistor MB2 may be directly coupled to the light emitting unit D. By controlling the operations of the first driving transistor MA2 and the second driving transistor MB2, the magnitude of the current If flowing through the light emitting unit D would be controlled.

In an embodiment of the disclosure, the light emitting unit driving circuit 100 may further comprise a first capacitor Cgs1 and a second capacitor Cgs2. The first capacitor Cgs1 is coupled to the first terminal (e.g., the source) and the control terminal (e.g., the gate) of the first driving transistor MA2, and is used to maintain the voltage level of the bias voltage Vx1. The second capacitor Cgs2 is coupled between the first terminal (e.g., the source) and the control terminal (e.g., the gate) of the second driving transistor MB2 to maintain the voltage level of the bias voltage Vx2. In an embodiment, the first capacitor Cgs1 is electrically connected to the first driving transistor MA2. The second capacitor Cgs2 is electrically connected to the second driving transistor MB2. The capacitance of the first capacitor Cgs1 may be substantially equal to the capacitance of the second capacitor Cgs2, but is not limited thereto. It could be understood that, in some embodiments of the present disclosure, the light emitting unit driving circuit 100 may not necessarily comprise the first capacitor Cgs1 and the second capacitor Cgs2. In other words, the first capacitor Cgs1 and the second capacitor Cgs2 are optional components.

Figure 3:
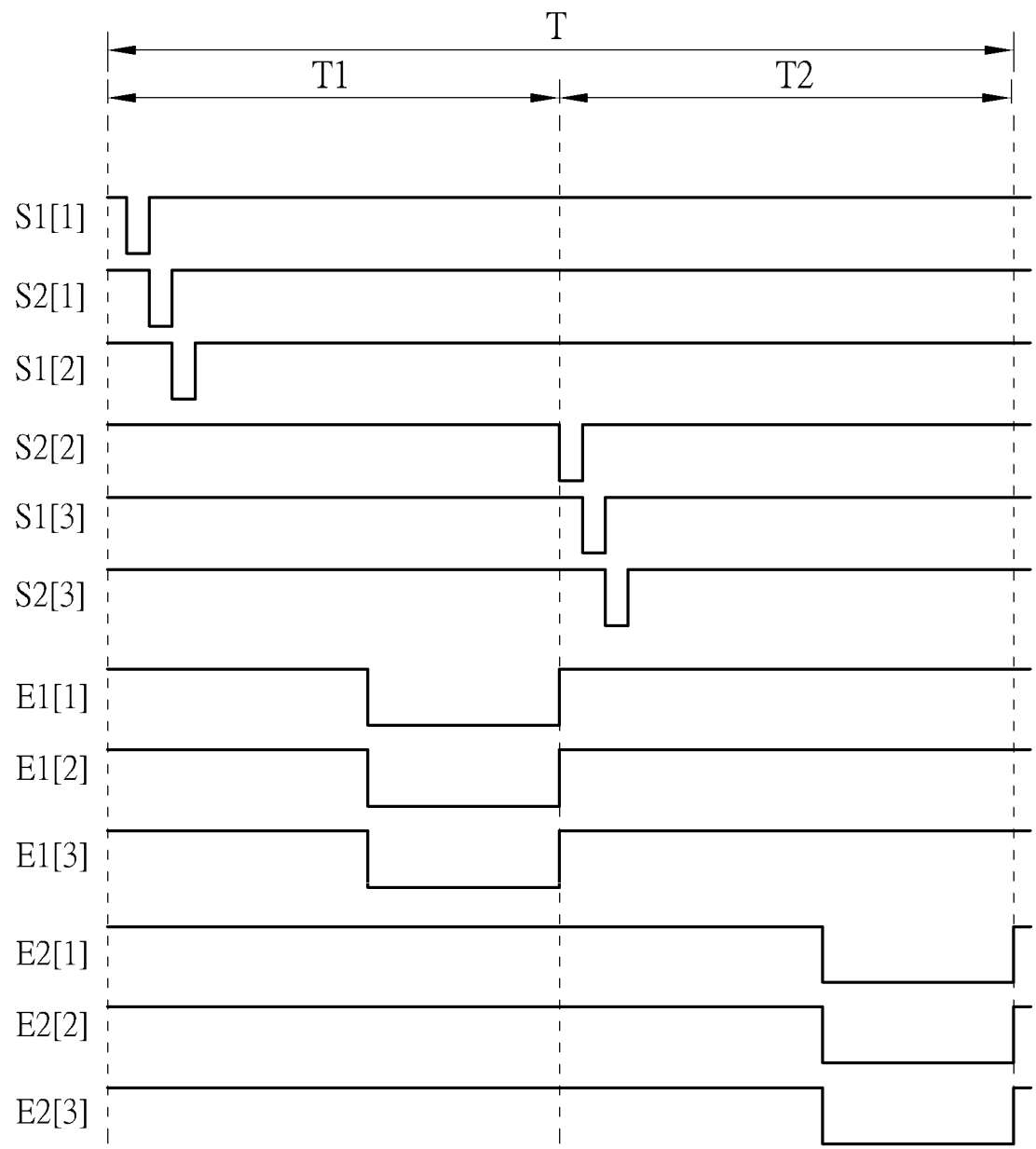
FIG. 3 is a timing diagram of the electronic device in FIG. 1 according to an embodiment of the present disclosure.

FIG. 3 is a timing diagram of the electronic device 10 in FIG. 1 according to an embodiment of the present disclosure. In an embodiment of the present disclosure, the electronic device 10 would refresh the voltage levels of the first data line D1[x] and the second data line D2[x] of the light emitting unit driving circuit 100 and refresh the magnitude of the current If flowing through the light emitting unit D every time period T. In this embodiment, only one of the first current Ia and the second current Ib flows through the light emitting unit D at the same time. The time period T may comprise a first sub-period T1 and a second sub-period T2. During the first sub-period T1, the first scan lines S1[1] to S1[N] may be at a low voltage level for a period of time sequentially. When the first scan line S1[y] is at a low voltage level, the voltage level of the corresponding first data line D1[x] is written to the corresponding first driving transistor MA2 to change the corresponding bias voltage Vx1. Then, the voltage levels of the first control lines E1[1] to E1[N] are pulled down to a low voltage level, so that the corresponding first light emitting control transistor MA3 is turned on and the first current Ia flows through the light emitting unit D. Similarly, during the second sub-period T2, the second scan lines S2[1] to S2[N] are sequentially at a low voltage level for a period of time. When the second scan line S2[y] is at the low voltage level, the voltage level of the corresponding second data line D2[x] is written to the corresponding second driving transistor MB2 to change the corresponding bias voltage Vx2. Then, the voltage levels of the second control lines E2[1] to E2[N] are pulled down to the low voltage level, such that the corresponding second light emitting control transistor MB3 is turned on and the second current Ib flows through the light emitting unit D. In other embodiments, the first light emitting control transistor MA3 and the second light emitting control transistor MB3 may be controlled such that the first current Ia and the second current Ib may flow together through the light emitting unit D.

Figure 4:
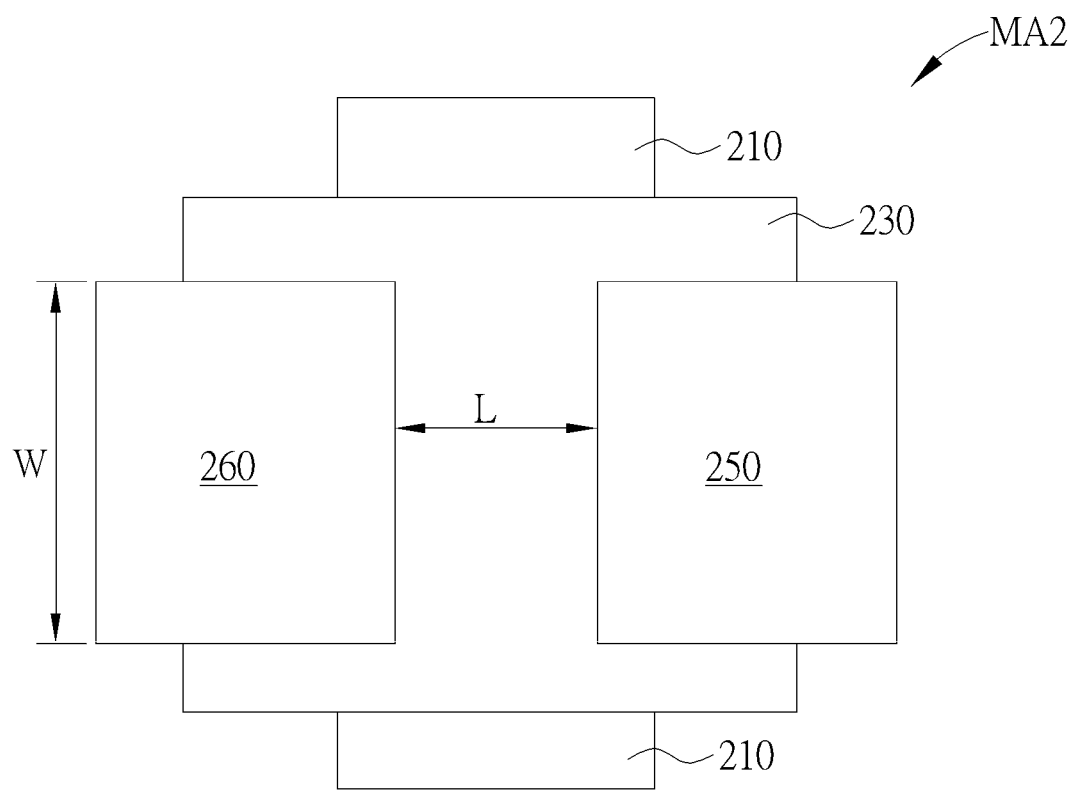
FIG. 4 is a top view of a first driving transistor of the light emitting unit driving circuit in FIG. 2 according to an embodiment of the present disclosure.

In this embodiment, the first driving transistor MA2 and the second driving transistor MB2 may be, for example, thin film transistors (TFTs), but are not limited thereto. The structure of the first driving transistor MA2 may be similar to that of the second driving transistor MB2. Hereinafter, the first driving transistor MA2 will be described as an example. FIG. 4 is a top view of the first driving transistor MA2 of the light emitting unit driving circuit 100 in FIG. 2 according to an embodiment of the present disclosure. The first driving transistor MA2 may have a gate 210, a source 250, and a drain 260. The gate 210 may be formed on a substrate, and a gate insulating layer may be formed on the gate 210. The material of the gate insulating layer may comprise an insulating material such as silicon nitride, silicon oxide, other suitable materials, or a combination of the above materials, but is not limited thereto. A semiconductor layer 230 may be formed on the gate insulating layer. The semiconductor layer 230 may comprise an amorphous semiconductor, a poly-crystalline semiconductor, a metal oxide (e.g., Indium Gallium Zinc Oxide (IGZO)), other suitable materials, or a combination of the above materials, but is not limited thereto. The first driving transistor MA2 has a channel width W and a channel length L, and the width/length ratio of the channel of the first driving transistor MA2 is defined as w/L. The width/length ratio could be obtained according to a conventional measurement method in the art, and will not be described here. The structure of the second driving transistor MB2 is similar to that of the first driving transistor MA2, and the difference between the two driving transistors MA2 and MB2 is that the width/length ratio of the second driving transistor MB2 is not equal to the width/length ratio the first driving transistor MA2. For example, the ratio of the channel width W and the channel length L of the first driving transistor MA2 is greater than the ratio of the channel width and the channel length of the second driving transistor MB2. In an embodiment of the disclosure, the channel width W of the first driving transistor MA2 may be substantially equal to 12 micrometers (μm), the channel length L of the first driving transistor MA2 may be substantially equal to 6 micrometers, and the width/length ratio of the first driving transistor MA2 is equal to (i.e., 12 μm/6 μm). The channel width W of the second driving transistor MB2 may be substantially equal to 6 micrometers, the channel length L of the second driving transistor MB2 may be substantially equal to 6 micrometers, and the width/length ratio of the second driving transistor MB2 is equal to 1 (i.e., 6 μm/6 μm). It could be noted that the above dimensions are merely exemplary, and the disclosure is not limited thereto. The channel lengths and channel widths of the first driving transistor MA2 and the second driving transistor MB2 may be other sizes.

Since a transistor having a large width/length ratio could withstand a greater source-drain current than a transistor having a small width/length ratio, the first driving transistor MA2 and the second driving transistor MB2 of different width/length ratios could be used to provide the current If of different current ranges. FIG. 5 is a diagram showing a relationship between a gate-source voltage $V_{GS1}$ and a source-drain current $I_{SD1}$ of the first driving transistor MA2 of the light emitting unit driving circuit 100 in FIG. 2 according to an embodiment of the present disclosure, and FIG. 6 is a relationship diagram between the gate-source voltage $V_{GS2}$ and the source-drain current $I_{SD2}$ of the second driving transistor MB2 of the light emitting unit driving circuit 100 in FIG. 2 according to an embodiment of the present disclosure. $V_{GS1}$ represents a voltage difference between the gate and the source of the first driving transistor MA2, $I_{SD1}$ represents a current flowing from the source of the first driving transistor MA2 to the drain of the first driving transistor MA2, $V_{GS2}$ represents a voltage difference between the gate and the source of the second driving transistor MB2, $I_{SD2}$ represents a current flowing from the source of the second driving transistor MB2 to the drain of the second driving transistor MB2. Furthermore, the gate-source voltage $V_{GS1}$ is substantially equal to the voltage difference between the bias voltage Vx1 and the first system voltage PVDD and the gate-source voltage $V_{GS2}$ is substantially equal to the voltage difference between the bias voltage Vx2 and the first system voltage PVDD. The source-drain current $I_{SD1}$ may be substantially equal to the first current Ia, and the source-drain current $I_{SD2}$ may be substantially equal to the second current Ib. For example, the magnitude of the current If flowing through the light emitting unit D may vary within a current range $I_0$ to $I_{255}$, so that the light emitting unit D may present 256 different values of brightness, and each value of the brightness is corresponded to one of the 256 gray levels of the light emitting unit driving circuit 100. It should be noted that the current range here is only an illustrative description. In fact, the current range and its corresponding brightness may be adjusted according to the design requirements. For example, voltage values $V_0$, $V_{64}$, $V_{127}$, $V_{128}$, and $V_{255}$ may respectively correspond to current values $I_0$, $I_{64}$, $I_{127}$, $I_{128}$, and $I_{255}$, and the current value $I_{255}$ may be greater (or less) than current value $I_0$. In this embodiment, the width/length ratio of the first driving transistor MA2 may be greater (or less) than the width/length ratio of the second driving transistor MB2. The first driving transistor MA2 is used to provide the first current Ia corresponding to a first current range, and the second driving transistor MB2 is used to provide the second current Ib corresponding to a second current range. The first current range may not overlap with the second current range. For example, the first current range may comprise $I_0$ to $I_N$, and the second current range may comprise $I_{N+1}$ to $I_{255}$, where N may be an integer from 1 to 253, such as 50, 100, 125, 126, 127, 128, 129, 130, 131, 135, 150, or 175, but is not limited thereto. For instance, the width/length ratio of the first driving transistor MA2 may be greater than the width/length ratio of the second driving transistor MB2, and the current value $I_{255}$ may be greater than the current value $I_0$. The first driving transistor MA2 may be used to provide the first current Ia within the current range $I_{128}$ to $I_{255}$, and the second driving transistor MB2 may be used to provide the second current Ib within the current range $I_0$ to $I_{127}$, but is not limited thereto. The current range $I_{128}$ to $I_{255}$ may not overlap with the current range $I_0$ to $I_{127}$.

One of the first light emitting control transistor MA3 and the second light emitting control transistor MB3 may be selectively turned on based on a desired magnitude of the current If, such that one of the first current Ia and the second current Ib would be equal to the current If. For example, when the desired magnitude of the current If is within the first current range, the first light emitting control transistor MA3 of the light emitting unit driving circuit 100 is turned on. When the desired magnitude of the current If is within the second current range, the second light emitting control transistor MB3 is turned on. For instance, when the magnitude of the current If is within the current range $I_{128}$ and $I_{255}$, the first light emitting control transistor MA3 of the light emitting unit driving circuit 100 is turned on. When the magnitude of the current If is within the current range $I_0$ to $I_{127}$, the second light emitting control transistor MB3 is turned on.

When the light emitting unit driving circuit 100 starts to operate, the relationship between the gate-source voltage $V_{GS1}$ and the source-drain current $I_{SD1}$ of the first driving transistor MA2 may be, for example, presented by a curve 301, and the relationship between the gate voltage $V_{GS2}$ and the source-drain current $I_{SD2}$ of the second driving transistor MB2 may be, for example, presented by a curve 401. However, when the light emitting unit driving circuit 100 operates for a period of time, the relationship between the gate-source voltage $V_{GS1}$ and the source-drain current $I_{SD1}$ of the first driving transistor MA2 and the relationship between the gate voltage $V_{GS2}$ and the source-drain current $I_{SD2}$ of the second driving transistor MB2 may drift to be presented by curves 302 and 402 respectively. The current value corresponding to the original voltage value $V_{128}$ in FIG. 5 may change from the original $I_{128}$ to $I_{128\_RA}$, and the current value corresponding to the original voltage value V64 in FIG. 6 may change from the original $I_{64}$ to $I_{64\_RA}$. However, since the source-drain current $I_{SD1}$ of the first driving transistor MA2 is varied within the current range $I_0$ to $D_{127}$, and the source-drain current $I_{SD2}$ of the second driving transistor MB2 would be varied within the current range $I_{128}$ to $I_{255}$, the degree of drift using the first driving transistor MA2 and the second driving transistor MB2 may be less than the degree of drift using only a single driving transistor, which has a corresponding current range $I_0$ to $I_{255}$.

Figure 7:
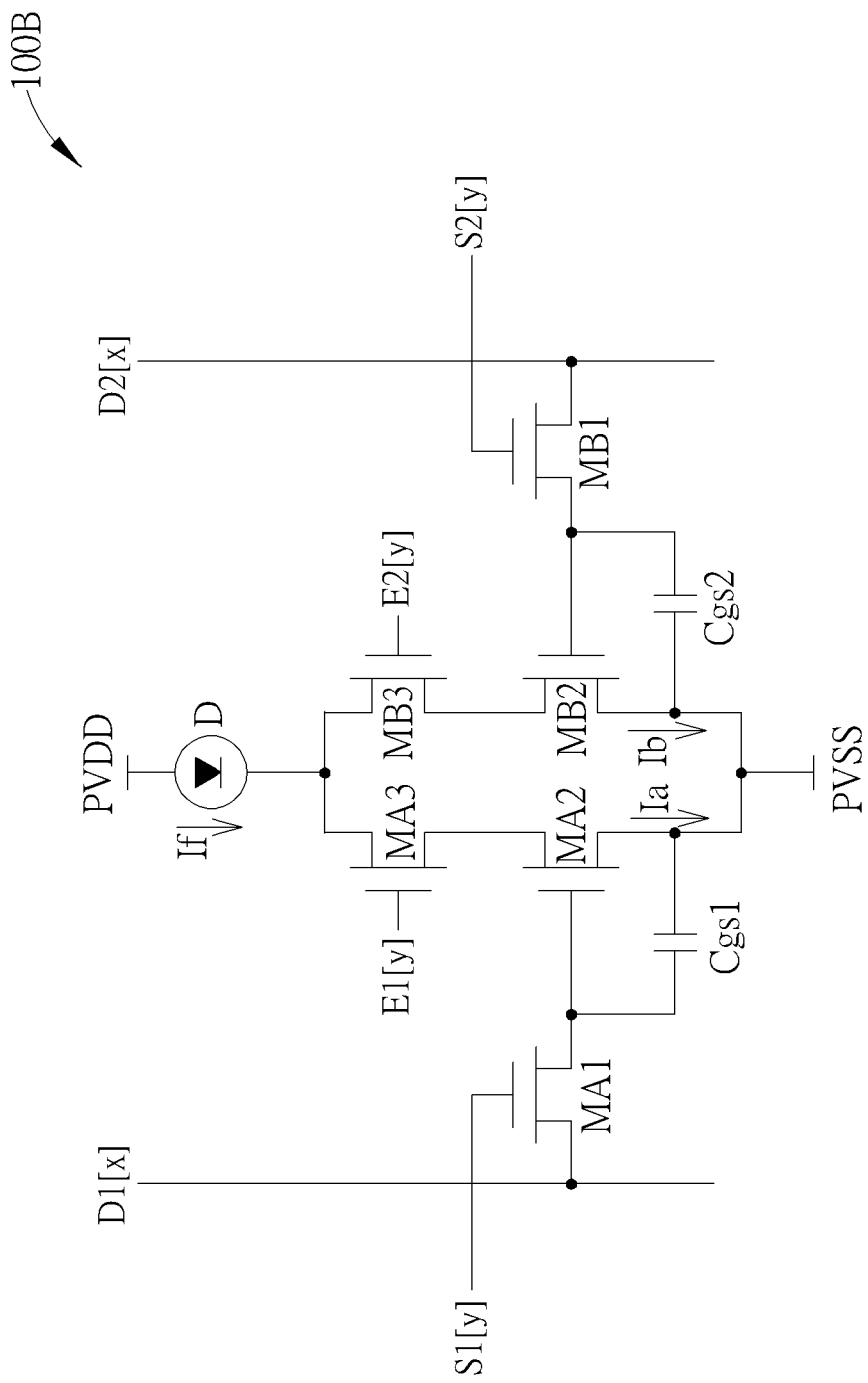
FIGS. 7 and 8 are circuit diagrams of a light emitting unit driving circuit respectively according to an embodiment of the present disclosure.

In the above embodiment, the transistors of the light emitting unit driving circuit 100 may all be P-type transistors (as shown in FIG. 2), but the light emitting unit driving circuit of the present disclosure may also adopt N-type transistors. FIG. 7 is a circuit diagram of a light emitting unit driving circuit 100B according to an embodiment of the present disclosure. The first switching transistor MA1, the second switching transistor MB1, the first driving transistor MA2, the second driving transistor MB2, the first light emitting control transistor MA3, and the second light emitting control transistor MB3 may all be N-type transistors. The driving manner of the light emitting unit driving circuit 100B is similar to the driving manner of the light emitting unit driving circuit 100. The main difference between the two light emitting unit driving circuits 100 and 100B is that the signals as shown in FIG. 3 would be inversely processed so as to control the operations of the light emitting unit driving circuit 100B. In an embodiment, the transistors of the light emitting unit driving circuit may comprise P-type and N-type transistors.

Figure 8:
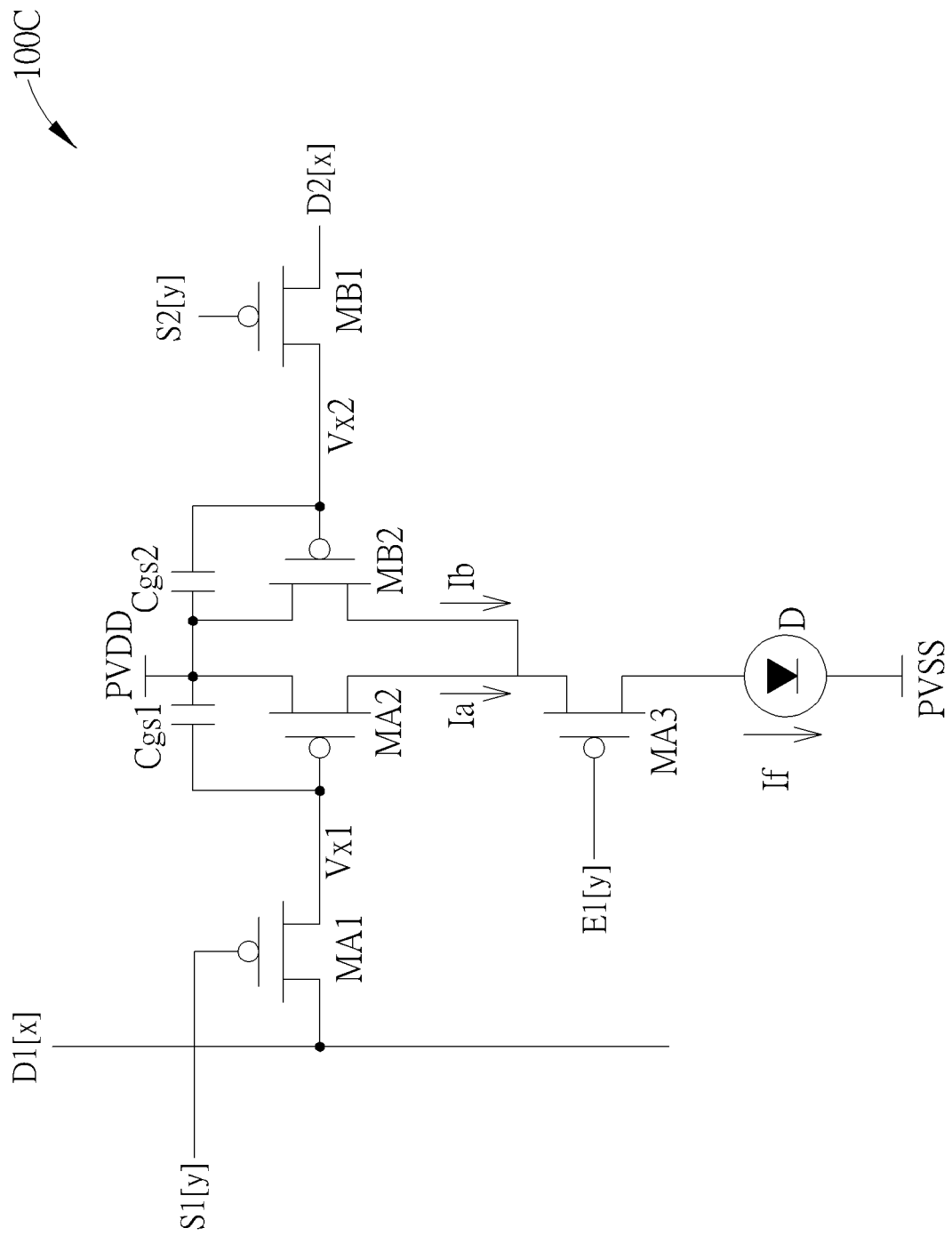
Figure 9:
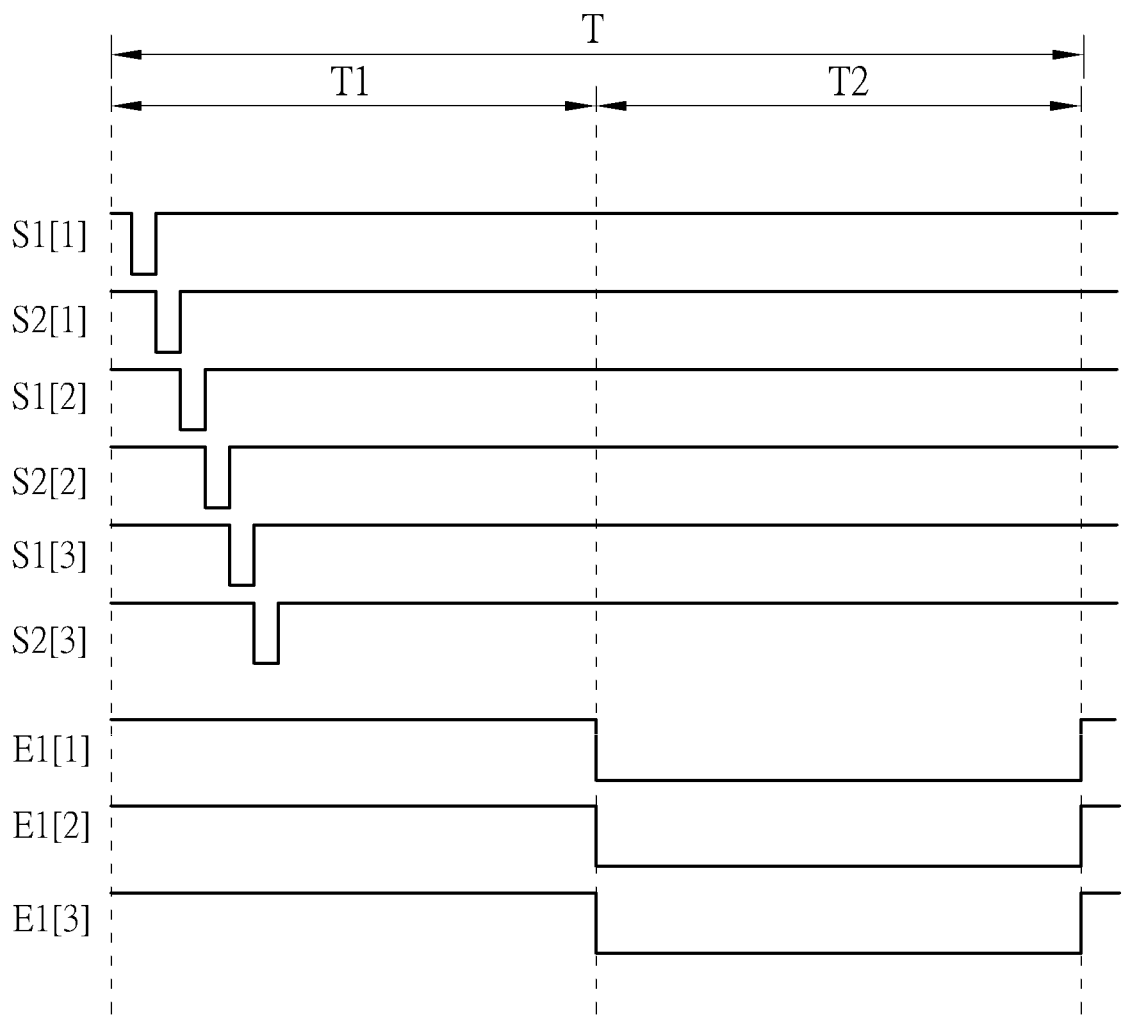
FIG. 9 is a timing diagram of the light emitting unit driving circuit in FIG. 8 according to an embodiment of the present disclosure.

In an embodiment of the present disclosure, one of the two transistors of the first light emitting control transistor MA3 and the second light emitting control transistor MB3 may be omitted. FIG. 8 is a circuit diagram of a light emitting unit driving circuit 100C according to an embodiment of the present disclosure. The main difference between the light emitting unit driving circuit 100C and the light emitting unit driving circuit 100 is that the light emitting unit driving circuit 100C uses only the first light emitting control transistor MA3 to control the current If flowing to the light emitting unit D. FIG. 9 is a timing diagram of the light emitting unit driving circuit 100C in FIG. 8 according to an embodiment of the present disclosure. During the first sub-period T1, the first scan lines S1[1] to S1[N] and the second scan lines S2[1] to S2[N] may be sequentially at a low voltage level for a period of time. The data is written to the corresponding first driving transistor MA2 and the corresponding second driving transistor MB2 through the corresponding first data line D1[x] and the second data line D2[x], such that the corresponding bias voltages Vx1 and Vx2 are changed respectively. During the second sub-period T2, the voltage level of the first control line E1[y] is pulled down to a low voltage level, and the corresponding first light emitting control transistor MA3 is turned on, so that the first current Ia and the second current Ib can flow simultaneously through the light emitting unit D.

Figure 10:
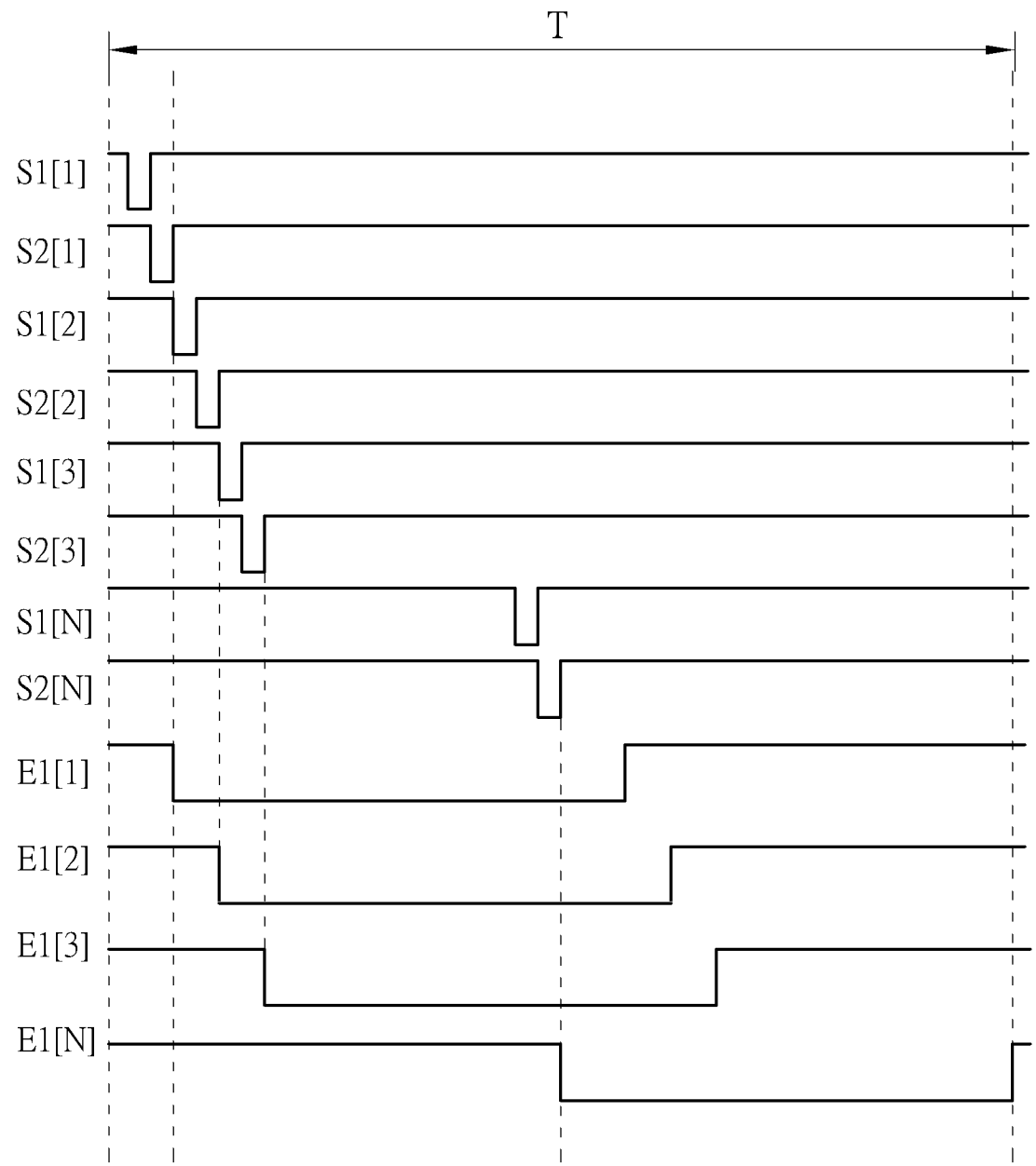
FIG. 10 is another timing diagram of the light emitting unit driving circuit in FIG. 8 according to an embodiment of the present disclosure.

FIG. 10 is another timing diagram of the lighting unit driving circuit 100C in FIG. 8 according to an embodiment of the present disclosure. Different from the driving method shown in FIG. 9, in the embodiment, when the first scan line S1[y] and the second scan line S2[y] are sequentially at a low voltage level for a period of time, data is written to the corresponding first driving transistor MA2 and second driving transistor MB2 through the first data line D1[x] and the second data line D2[x] sequentially, then the voltage levels of the corresponding first control lines E1[y] (i.e., E[1] to E1[N]) may be sequentially pulled down to a low level, such that the corresponding first light emitting control transistor MA3 is turned on, and the first current Ia and the second current Ib are simultaneously flowed through the light emitting unit D.

Figure 11:
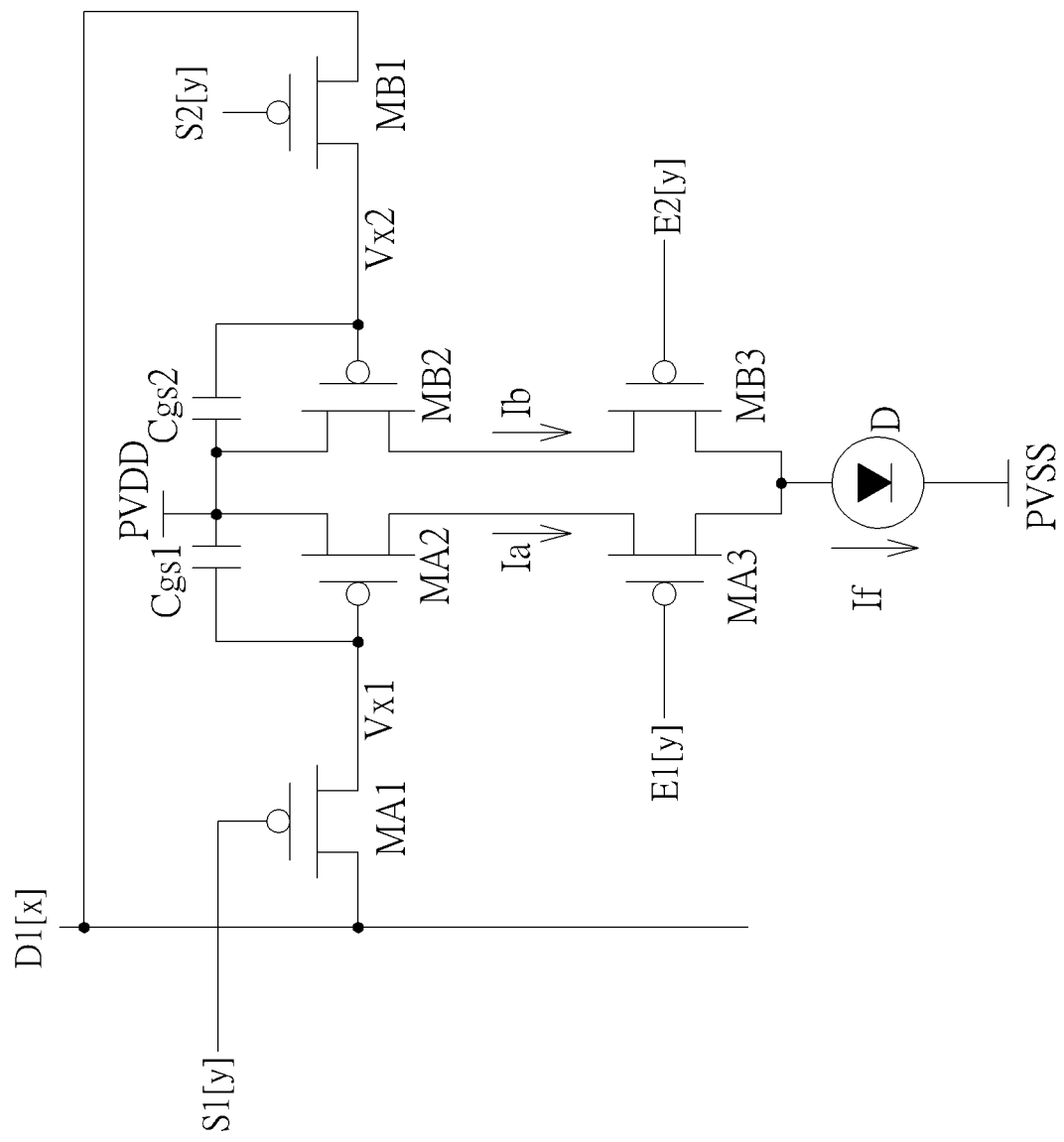
FIGS. 11 and 12 are circuit diagrams of a light emitting unit driving circuit according to another embodiment of the present disclosure.

FIG. 11 is a circuit diagram of a light emitting unit driving circuit 100D according to another embodiment of the present disclosure. The light emitting unit driving circuit 100D is a modified version of the light emitting unit driving circuit 100 shown in FIG. 2. In FIG. 2, the first switching transistor MA1 and the second switching transistor MB1 are respectively coupled to the first data line D1[x] and the second data line D2[x]. However, in FIG. 11, the switching transistor MA1 and the second switching transistor MB1 of the light emitting unit driving circuit 100D are both coupled to the first data line D1[x]. By controlling the first scan line S1[y] and the second scan line S2[y], the first switching transistor MA1 and the second switching transistor MB1 are turned on at different times. When the first switching transistor MA1 is turned on and the second switching transistor MB1 is turned off, the bias voltage Vx1 is refreshed through the first data line D1[x] while the bias voltage Vx2 is not refreshed. When the second switching transistor MB1 is turned on and the first switching transistor MA1 is turned off, the bias voltage Vx2 is refreshed through the first data line D1[x] while the bias voltage Vx1 is not refreshed.

Figure 12:
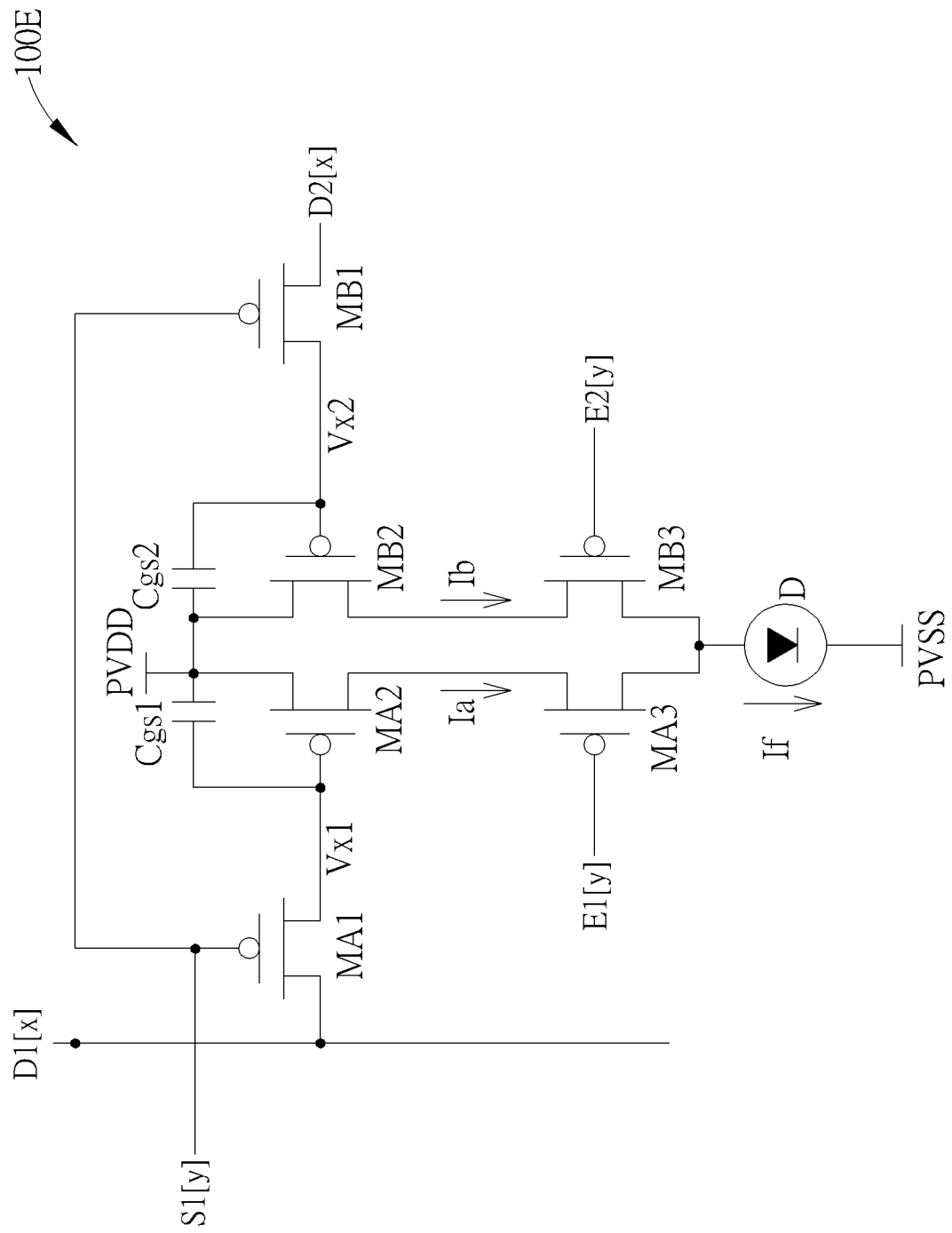

FIG. 12 is a circuit diagram of a light emitting unit driving circuit 100E according to another embodiment of the present disclosure. The light emitting unit driving circuit 100E is another modified version of the light emitting unit driving circuit 100 shown in FIG. 2. In FIG. 2, the first switching transistor MA1 and the second switching transistor MB1 are respectively coupled to the first scan line S1[y] and the second scan line S2[y]. However, in FIG. 12, the first switching transistor MA1 and the second switching transistor MB1 of the light emitting unit driving circuit 100D are both coupled to the first scan line S1[y]. When the first scan line S1[y] is at a low voltage level to simultaneously turn on the first switching transistor MA1 and the second switching transistor MB1, the bias voltages Vx1 and Vx2 are refreshed by the first data line D1[x] and the second data line D2[x] respectively.

In summary, the first driving transistor and the second driving transistor of the light emitting unit driving circuit of the electronic device would respectively provide the first current and the second current to the light emitting unit, so that the light emitting unit may be driven by different currents. As a result, the convenience of operation may be improved. Furthermore, the first current and the second current may be respectively within different current ranges, and the electronic device would selectively turn on/off relevant transistors thereof according to the driving current required by the light emitting unit, so that the efficiency of refreshing the driving current of the light emitting unit may be improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, each of the claims constitutes an individual embodiment, and the scope of the disclosure also includes the scope of the various claims and combinations of the embodiments. The scope of the disclosure is subject to the definition of the scope of the claims.

What is claimed is:
1. A light emitting unit driving circuit, comprising:
  a first driving transistor having a first channel width and a first channel length and being configured to provide a first current;
  a second driving transistor having a second channel width and a second channel length and being configured to provide a second current;

a light emitting unit electrically connected to the first driving transistor and the second driving transistor, and configured to receive at least one of the first current and the second current so as to emit light;

a first light emitting control transistor electrically connected between the first driving transistor and the light emitting unit; and a second light emitting control transistor electrically connected between the second driving transistor and the light emitting unit;

wherein a first ratio of the first channel width to the first channel length is different from a second ratio of the second channel width to the second channel length; and wherein when the first driving transistor and the second driving transistor are turned on, the first current and the second current flow through the light emitting unit, a magnitude of the first current is within a first current range, a magnitude of the second current is within a second current range, and the first current range does not overlap with the second current range.

2. The light emitting unit driving circuit of claim 1, further comprising:
a first data line;
a second data line;
a first scan line;
a second scan line;
a first switching transistor electrically connected to the first data line, the first driving transistor, and the first scan line; and
a second switching transistor electrically connected to the second data line, the second driving transistor, and the second scan line.

3. The light emitting unit driving circuit of claim 1, further comprising:
a first data line;
a second data line;
a scan line;
a first switching transistor electrically connected to the first data line, the first driving transistor, and the scan line; and
a second switching transistor electrically connected to the second data line, the second driving transistor, and the scan line.

4. The light emitting unit driving circuit of claim 1, further comprising:
a data line
a first scan line;
a second scan line;
a first switching transistor electrically connected to the data line, the first driving transistor, and the first scan line; and
a second switching transistor electrically connected to the data line, the second driving transistor, and the second scan line.

5. The light emitting unit driving circuit of claim 1, further comprising:
a first capacitor electrically connected to the first driving transistor; and
a second capacitor electrically connected to the second driving transistor.

6. The light emitting unit driving circuit of claim 5, wherein capacitance of the first capacitor is equal to the capacitance of the second capacitor.

7. An electronic device comprising a light emitting unit driving circuit, and the light emitting unit driving circuit comprising:

a first driving transistor having a first channel width and a first channel length and being configured to provide a first current;

a second driving transistor having a second channel width and a second channel length and being configured to provide a second current;

a light emitting unit electrically connected to the first driving transistor and the second driving transistor, and configured to receive at least one of the first current and the second current so as to emit light;

a first light emitting control transistor electrically connected between the first driving transistor and the light emitting unit; and a second light emitting control transistor electrically connected between the second driving transistor and the light emitting unit;

wherein a first ratio of the first channel width to the first channel length is different from a second ratio of the second channel width to the second channel length; and wherein when the first driving transistor and the second driving transistor are turned on, the first current and the second current flow through the light emitting unit, a magnitude of the first current is within a first current range, a magnitude of the second current is within a second current range, and the first current range does not overlap with the second current range.

8. The electronic device of claim 7, wherein the light emitting unit driving circuit further comprises:
a first data line;
a second data line;
a first scan line;
a second scan line;
a first switching transistor electrically connected to the first data line, the first driving transistor, and the first scan line; and
a second switching transistor electrically connected to the second data line, the second driving transistor, and the second scan line.

9. The electronic device of claim 7, wherein the light emitting unit driving circuit further comprises:
a first data line;
a second data line;
a scan line
a first switching transistor electrically connected to the first data line, the first driving transistor, and the scan line; and
a second switching transistor electrically connected to the second data line, the second driving transistor, and the scan line.

10. The electronic device of claim 7, wherein the light emitting unit driving circuit further comprises:
a data line
a first scan line;
a second scan line;
a first switching transistor electrically connected to the data line, the first driving transistor, and the first scan line; and
a second switching transistor electrically connected to the data line, the second driving transistor, and the second scan line.

11. The electronic device of claim 7, wherein the light emitting unit driving circuit further comprises:
a first capacitor electrically connected to the first driving transistor; and
a second capacitor electrically connected to the second driving transistor.

12. The electronic device of claim 11, wherein capacitance of the first capacitor is equal to the capacitance of the second capacitor.

* * * * *